(12) United States Patent
Snider

(10) Patent No.: US 7,359,888 B2
(45) Date of Patent: *Apr. 15, 2008

(54) MOLECULAR-JUNCTION-NANOWIRE-CROSSBAR-BASED NEURAL NETWORK

(75) Inventor: Greg Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 724 days.

This patent is subject to a terminal disclaimer.

(21) Appl. No.: 10/355,801

(22) Filed: Jan. 31, 2003

(65) Prior Publication Data

US 2004/0150010 A1 Aug. 5, 2004

(51) Int. Cl.
- *G06E 1/00* (2006.01)
- *G06E 3/00* (2006.01)
- *G06F 15/18* (2006.01)
- *G06G 7/00* (2006.01)

(52) U.S. Cl. .............................. 706/26; 706/15; 706/27; 977/938

(58) Field of Classification Search .................. 706/26, 706/29, 15, 27; 716/17; 977/712, 839, 938; 327/365

See application file for complete search history.

(56) References Cited

U.S. PATENT DOCUMENTS

| | | | | |
|---|---|---|---|---|
| 2,835,829 A | * | 5/1958 | Chollet et al. | ............... 327/487 |
| 4,823,174 A | * | 4/1989 | Itoh et al. | .................... 257/198 |
| 6,128,214 A | * | 10/2000 | Kuekes et al. | ............... 365/151 |
| 6,314,019 B1 | | 11/2001 | Kuekes et al. | |
| 6,735,579 B1 | * | 5/2004 | Woodall | ....................... 706/20 |
| 6,889,216 B2 | | 5/2005 | Nugent | |
| 2003/0200521 A1 | * | 10/2003 | DeHon et al. | ................. 716/16 |
| 2003/0236760 A1 | * | 12/2003 | Nugent | ......................... 706/26 |
| 2004/0039717 A1 | | 2/2004 | Nugent | |
| 2004/0041617 A1 | * | 3/2004 | Snider et al. | ................ 327/365 |

OTHER PUBLICATIONS

Gudiksen, Mark S., et al., "Growth of nanowire superlattice structures for nanoscale photonics and electronics", Nature, vol. 415, Feb. 7, 2002.

* cited by examiner

Primary Examiner—Joseph P Hirl

(57) ABSTRACT

A method for configuring nanoscale neural network circuits using molecular-junction-nanowire crossbars, and nanoscale neural networks produced by this method. Summing of weighted inputs within a neural-network node is implemented using variable-resistance resistors selectively configured at molecular-junction-nanowire-crossbar junctions. Thresholding functions for neural network nodes are implemented using pFET and nFET components selectively configured at molecular-junction-nanowire-crossbar junctions to provide an inverter. The output of one level of neural network nodes is directed, through selectively configured connections, to the resistor elements of a second level of neural network nodes via circuits created in the molecular-junction-nanowire crossbar. An arbitrary number of inputs, outputs, neural network node levels, nodes, weighting functions, and thresholding functions for any desired neural network are readily obtained by the methods of the present invention.

17 Claims, 17 Drawing Sheets

$V_1g_1 + V_2g_2 + V_3g_3 + V_{offset}$

MOLECULAR-JUNCTION-NANOWIRE-CROSSBAR-BASED NEURAL NETWORK

TECHNICAL FIELD

The present invention is related to hardware, or circuit-level, implementations of neural networks and, in particular, to a method for configuring nanoscale-sized neural networks from molecular-junction-nanowire crossbars that may be integrated with additional components in extremely dense electrical subsystems.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating microscale and nanoscale electronic devices using alternative technologies, where nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits. Even were such straightforwardly miniaturized circuits able to feasibly manufactured, the much higher component densities that ensue from combining together nanoscale components necessitate much different strategies related to removing waste heat produced by the circuits In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Neural networks have been developed over the past 25 years as a useful tool for solving complex pattern matching and decision-making problems. Neural networks are often implemented in software, but may also be implemented as logic circuits. FIG. 1 illustrates a relatively simple, two-level neural network. In the example neural network shown in FIG. 1, there are three inputs 102-104. The neural network circuit is enclosed by a square dashed line 105. Based on the values of the three inputs 102-104, the neural network circuit 105 produces two outputs 106 and 107. The neural network shown in FIG. 1 includes two layers of nodes. The first layer comprises nodes 110-113 and the second layer of nodes comprises nodes 115 and 116. Each node receives, as input, a number of input signals, and produces an output signal. For example, node 110 receives, as input, signals 118 and 120, which are, in this case, input signals "$in_1$" 102 and "$in_2$" 103. Neural network $node_{11}$ 110 applies weighting factors $w^1{}_{11}$ to input 118 and $w^2{}_{11}$ to input 120, sums the two weighted inputs, and then outputs a signal that represents a function of the summed, weighted inputs. In the neural network shown in FIG. 1, $node_{11}$ outputs signals 122 and 123 to second-level nodes $node_{21}$ 115 and $node_{22}$ 116, the output signal equal to $f_{11}$ ($in_1$, $in_2$), where $f_{11}$ is the function [$w^1{}_{11} in_1 + w^2{}_{11} in_2$] carried out by $node_{11}$ on the inputs "$in_1$" 102 and "$in_2$" 103. Each level-one node 110-113 receives some combination of input signals from inputs "$in_1$" 102, "$in_2$" 103, and "$in_3$" 104. The signals output from the level-one nodes are input to the level-two nodes 115-116. In the neural network shown in FIG. 1, outputs of the level-two nodes are directly connected to the output signal lines 106 and 107, which represent the output of the neural-network circuit. The output of a neural network is thus a rather complex function of the input signals. For example, the output of the neural network shown in FIG. 1 to output signal line 106 may be described as follows:

$$out_1 = f_{21}[f_{11}(in_1, in_2), f_{12}(in_2 + in_3), f_{13}(in_1, in_2, in_3)]$$
$$= w^1{}_{21}(w^1{}_{11}in_1 + w^2{}_{11}in_2) + w^2{}_{21}(w^2{}_{12}in_2 + w^3{}_{12}in_3) + w^3{}_{21}(w^1{}_{13}in_1 + w^2{}_{13}in_2 + w^3{}_{13}in_3)$$

where $in_1$, $in_2$, and $in_3$ are the three signals input to the neural network;

$w^x{}_{yz}$ is the weight applied to the xth input signal by $node_{yz}$; and $f_{yz}$ is the function implemented by $node_{yz}$ that transfers the weighted sum of the input signals of $node_{yz}$ to the output signal for $node_{yz}$.

Very complex multi-layered neural networks containing hundreds or thousands of nodes are currently employed, both in software implementations as well as in hardware circuits, to solve a number of complex computing problems. As with all hardware implementations, there is an increasing need for smaller and smaller scale implementations. Designers, manufacturers, and users of neural network circuits have recognized the need for implementing neural networks using nanoscale electronic circuitry. Unfortunately, the current methods by which neural networks are fabricated are not amenable to simple miniaturization using nanowire-based structures similar to those currently employed at larger dimensions. Instead, designers, manufacturers, and users of devices that include neural networks have recognized the need for new methods for implementing neural networks that are useable at nanoscale dimensions. Moreover, to facilitate reuse and flexibility of neural network components, designers, manufacturers, and users of devices that include neural networks have recognized the need for reprogrammable neural networks that can be reconfigured for alternative uses or to enhance the devices in which they are included.

SUMMARY OF THE INVENTION

One embodiment of the present invention provides a method for configuring nanoscale neural network circuits using molecular-junction-nanowire crossbars. The summing of weighted inputs within a neural-network node is implemented using resistive elements selectively configured at molecular-junction-nanowire-crossbar junctions with selected resistances. A thresholding function for a neural network node is implemented using pFET and nFET components selectively configured at molecular-junction-nanowire-crossbar junctions to provide an inverter. The output of one level of neural network nodes is directed, through selectively configured connections, to the resistor elements of a second level of neural network nodes via circuits created in the molecular-junction-nanowire crossbar. An arbitrary number of inputs, outputs, neural network node levels, nodes, weighting functions, and thresholding functions for any desired neural network are readily obtained by the methods of the present invention.

Molecular-junction-nanowire crossbar implementations of neural networks consume very little power, and have extremely high densities. These extremely dense neural networks can then be combined into extremely dense subsystems that include many additional electrical components, implemented within a set of complementary/symmetry ("CS") lattices. Thus, rather than simply representing a miniaturization of existing neural network circuits, in isolation, the present invention provides for building neural networks into complex subsystems having transistor densities equal to, or greater than, 1 billion transistors/cm$^2$ or, in other words, having 1.0 giga-transistor/cm$^2$ densities and greater transistor densities.

DETAILED DESCRIPTION OF THE INVENTION

One embodiment of the present invention provides a method for configuring nanoscale neural network circuits using molecular-junction-nanowire crossbars. Background information about molecular-junction-nanowire crossbars and neural networks is provided, below, in a first subsection, and a number of embodiments of the present invention that employ molecular-junction-nanowire-crossbar technology are then discussed in a second subsection.

Molecular-Junction-Nanowire Crossbars

Figure 1:
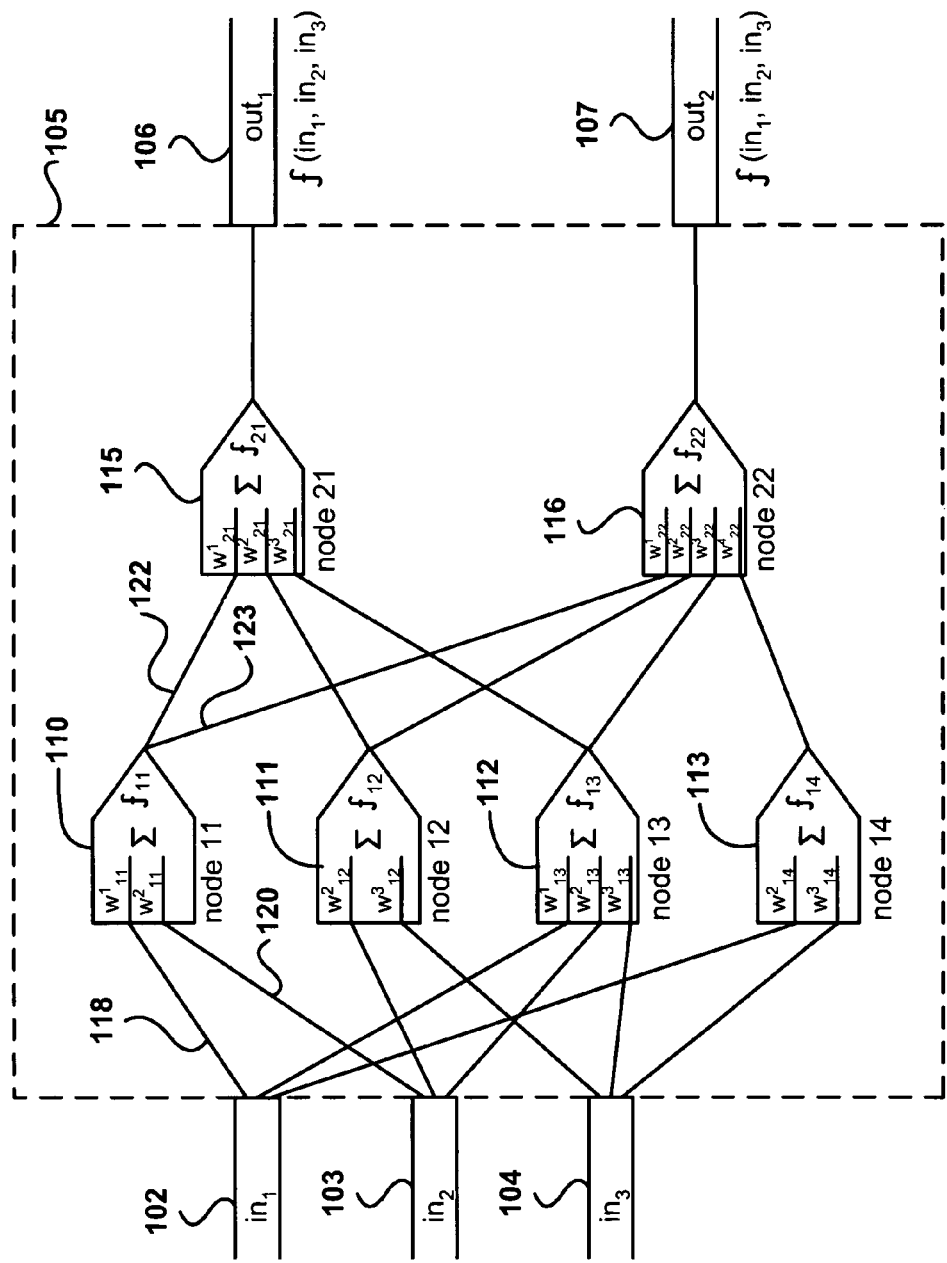
FIG. 1 illustrates a relatively simple, two-level neural network.
Figure 2:
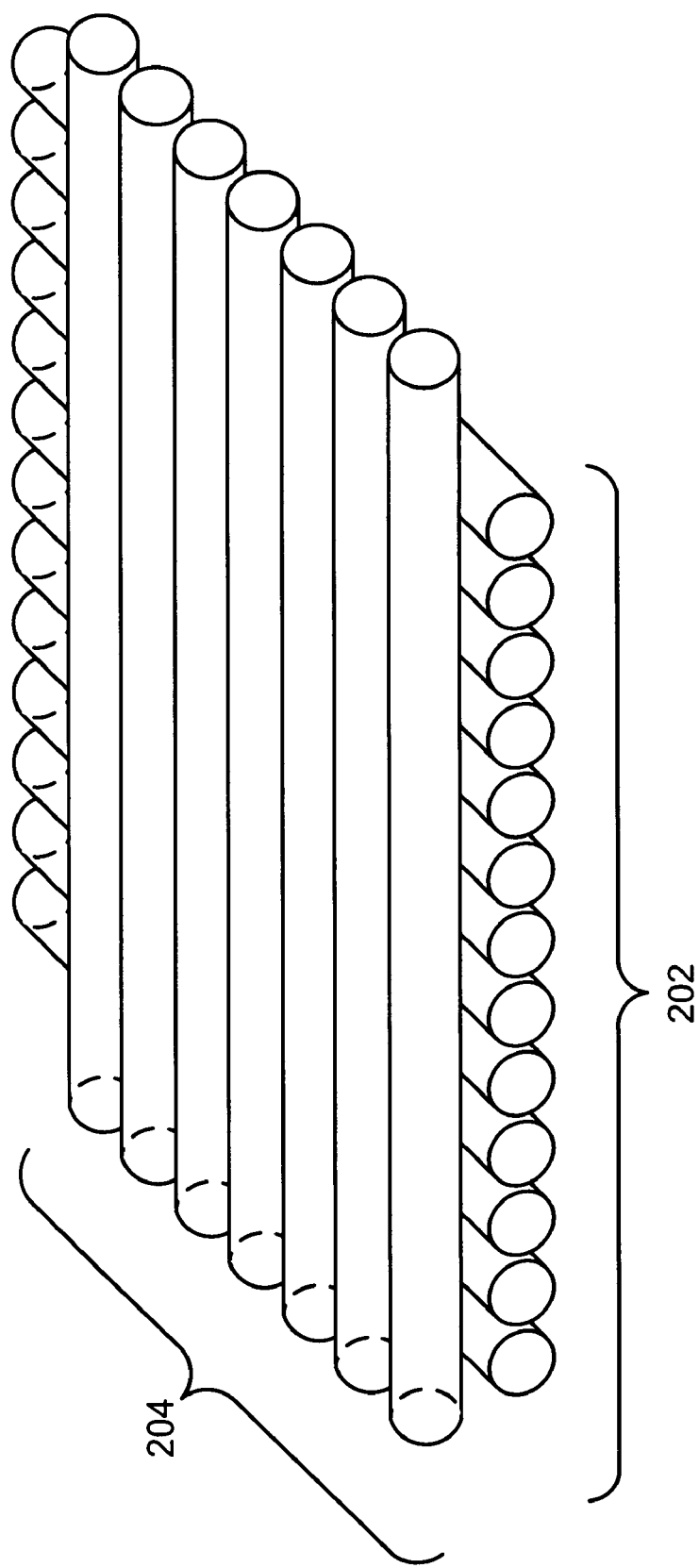
FIG. 2 illustrates a basic molecular-junction nanowire crossbar.

A relatively new and promising alternative technology involves molecular-junction-nanowire crossbars. FIG. 2 illustrates a molecular-junction-nanowire crossbar. In FIG. 2, a first layer of approximately parallel nanowires 202 is overlain by a second layer of approximately parallel nanowires 204 roughly perpendicular, in orientation, to the nanowires of the first layer 202, although the orientation angle between the layers may vary. The two layers of nanowires form a lattice, or crossbar, each nanowire of the second layer 204 overlying all of the nanowires of the first layer 202 and coming into close contact with each nanowire of the first layer 202 at intersection points, or junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-dimensional molecular-junction-nanowire crossbar comprising first and second layers, as shown in FIG. 2, can be manufactured via a relatively straightforward process. Many different types of conductive and semi-conductive nanowires can be chemically synthesized from metallic and semiconductor substances, from combinations of these types of substances, and from other types of substances. A molecular-junction-nanowire crossbar may be connected to microscale signal-line leads or other electronic leads through a variety of different methods to incorporate the nanowires into electrical circuits.

Figure 3:
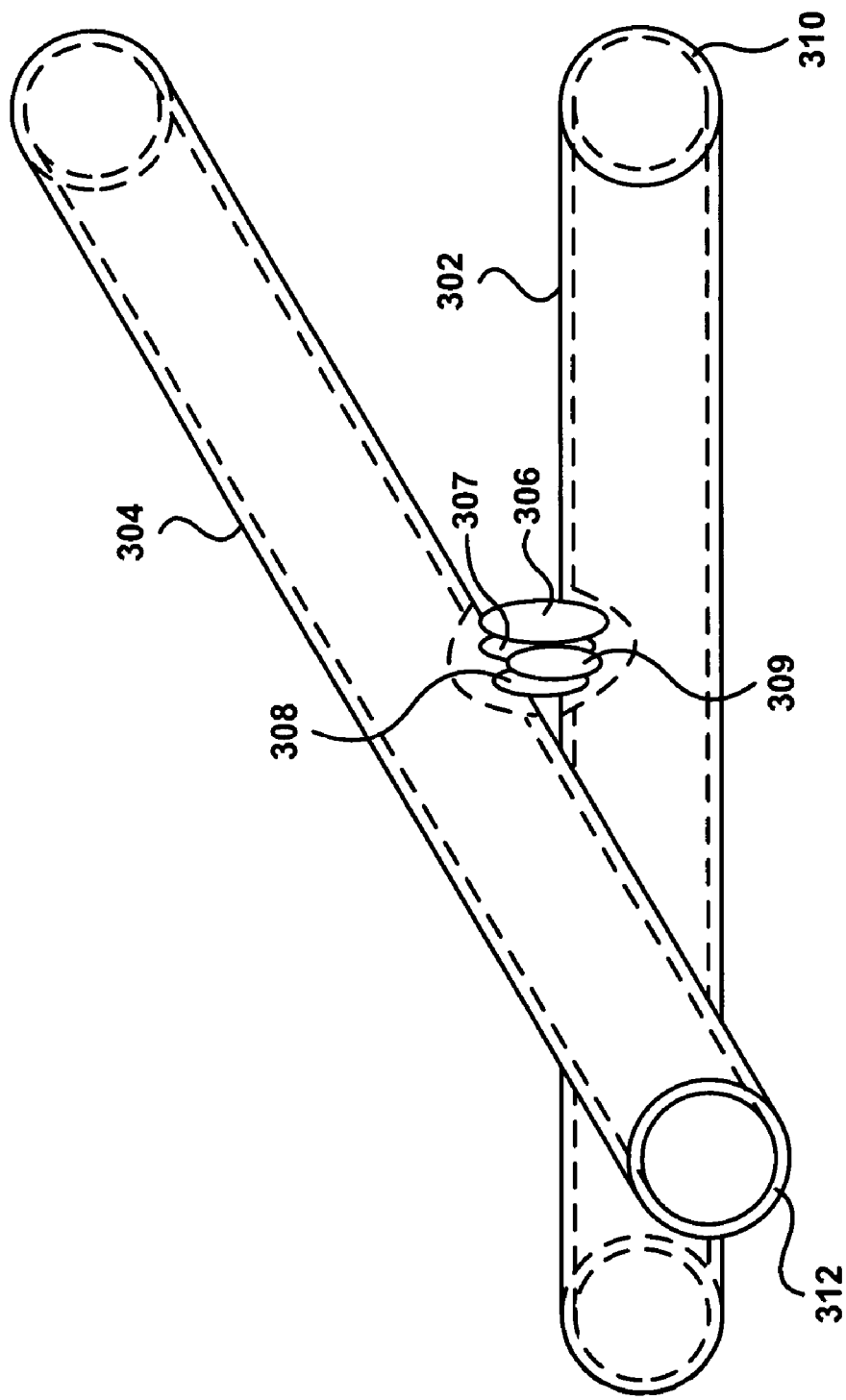
FIG. 3 illustrates a junction, or intersection, between two nanowires.
Figure 4A:
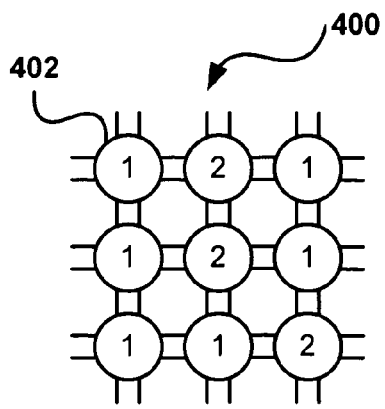
FIG. 4 illustrates one possible approach for configuring a network of nanoscale electrical components from a two-dimensional molecular-junction-nanowire crossbar.
Figure 4B:
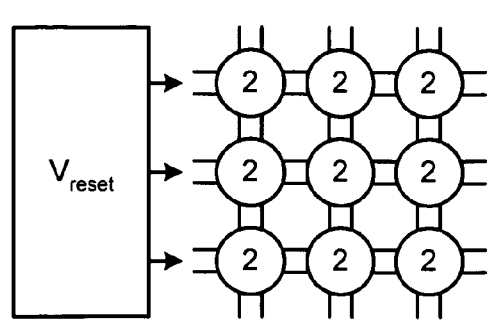
Figure 4C:
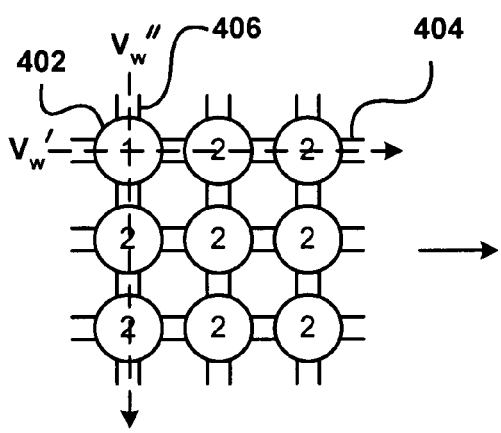
Figure 4D:
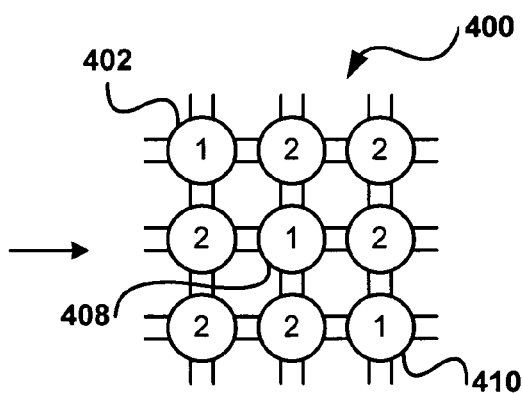
Figure 4E:
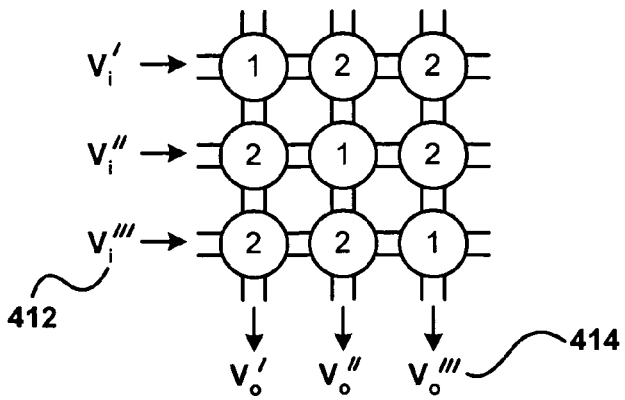

Molecular-junction-nanowire crossbars are not only layers of parallel conductive elements, but may also be used to create arrays of nanoscale electronic components, such as transistors, diodes, resistors, and other familiar basic electronic components. FIG. 3 illustrates a junction between nanowires of two contiguous layers within a molecular-junction-nanowire crossbar. In FIG. 3, the junction between a first nanowire 302 of a first nanowire layer intersects a second nanowire 304 of a second nanowire layer. Note that the junction may or may not involve physical contact between the two nanowires 302 and 304. As shown in FIG. 3, the two nanowires are not in physical contact at their closest point of approach, but the gap between them is spanned by a small number of molecules 306-309. Various different types of molecules may be introduced at junctions for a variety of different purposes. In many cases, the molecules of a junction may be accessed, for various purposes, through different voltage levels or current levels placed on the nanowires forming the junction. The molecules spanning the junction in FIG. 3 may have various different quantum states in which the molecules exhibit resistive, semiconductor-like, or conductive electrical properties. The current passing between the two nanowires intersecting at a junction may be a nonlinear function of the voltage across the junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a molecular junction is anisotropic, having a polarity or direction with respect to physical properties, including electrical properties. This anisotropy may arise from different chemical and/or physical properties of nanowires in the two layers of a molecular-junction-nanowire crossbar, may arise from asymmetries of junction molecules combined with junction molecules being uniformly oriented with respect to the nanowire layers, and may arise both from differences in the properties of the nanowires as well as junction-molecule asymmetries. The fact the molecular junctions may have polarities allows for controlling junction properties by applying positive and negative voltages to molecular junctions, eliciting forward and reverse currents within the molecular junctions.

As shown in FIG. 3, the nanowires may include outer coatings, such as outer coatings 310 and 312. The outer coatings may serve to insulate nanowires from one another, may constitute the molecules that serve to span junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning junctions between crossing nanowires may be introduced as a separate layer formed between layers of nanowires. In some cases, the state changes of junction molecules may not be reversible. For example, the junction molecules may initially be resistive, and may be made conductive through application of relatively high voltages. In other cases, the junction molecules may be conductive, but the molecules may be irreversibly damaged, along with portions of the nanowires proximal to the junctions, through application of very high voltage levels, resulting in disrupting conductivity between the two nanowires and breaking electrical connection between them. In yet other cases, the junction molecules may transition reversibly from one state to another and back, so that the nanoscale electrical components configured at nanowire junctions may be reconfigured, or programmed, by application of differential voltages to selected nanowire junctions.

FIG. 4 illustrates one possible approach to configuring a network of reconfigurable nanoscale electrical components from a two-dimensional molecular-junction-nanowire crossbar. In FIGS. 4A-E, a small 3×3 molecular-junction-nanowire crossbar is shown, with circles at all nine junctions to indicate the state of the junction molecules. In one state, labeled "1" in FIGS. 4A-E, the junction molecules may have certain semiconductor, or conductive properties, while in a second state, labeled "2" in FIGS. 4A-E, junction molecules may have different properties. Initially, as shown in FIG. 4A, the states of the junctions of the molecular-junction-nanowire crossbar 400 are indeterminate. In other words, as shown in FIG. 4A, the states of the junctions, such as junction 402, are randomly distributed between state "1" and state "2." Next, as shown in FIG. 4B, a reset voltage "$v_{reset}$," often either a relatively large positive or negative voltage, is applied to all junctions in order to uniformly set the states of all junctions to a particular state, in the case shown in FIG. 4B, state "2." Next, as shown in FIG. 4C, each junction may be uniquely accessed by applying a write voltage, or configuring voltage, to the nanowires that form the junction in order to configure, or program, the junction to have the state "1." For example, in FIG. 4C, a first write voltage $v_w$, is applied to horizontal nanowire 404 and a second write voltage $v_w$, is applied to vertical nanowire 406 to change the state of the junction from "2" to "1." Individual junctions may be configured through steps similar to the steps shown in FIG. 4C to finally result in a fully configured nanoscale component network as shown in FIG. 4D. Note that, in FIG. 4D, the states of junctions 402, 408, and 410 that form a downward-slanted diagonal through the molecular-junction-nanowire crossbar have been configured by selective application of write voltages. Finally, as shown in FIG. 4E, the nanoscale electrical component network can be used as a portion of an integrated circuit. Input voltages $v_i'$, $v_i''$, and $v_i'''$ may be applied to the nanoscale electrical component lattice as inputs 412 and output voltages $v_o'$, $v_o''$, and $v_o'''$ 414 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the write voltages $v_w$ and the reset voltages $v_{reset}$. Should the integrated circuit need to be reconfigured, the reset voltage $v_{reset}$ may be again applied to the molecular-junction-nanowire crossbar, as in FIG. 4B, and the device reconfigured, or reprogrammed, as shown in steps in FIGS. 4C-D. Depending on the types of nanowires, types of dopants employed in the case of semiconductor nanowires, and the types of junction molecules employed in the molecular-junction-nanowire crossbar, many different, but similar configuring processes may be used to configure molecular-junction-nanowire crossbars into nanowire-based electrical components networks. The example of FIG. 4 is meant to illustrate a general process by which molecular-junction-nanowire crossbars may be configured as useful portions of electronic circuits.

Figure 5A:
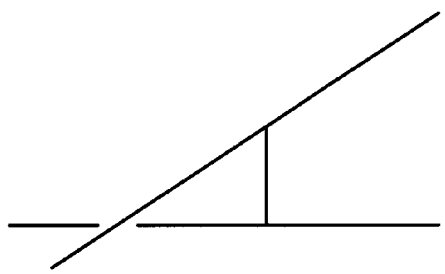
FIG. 5 schematically illustrates a number of simple electrical components that can be programmed at the junctions of nanowires in molecular-junction-nanowire crossbars.
Figure 5B:
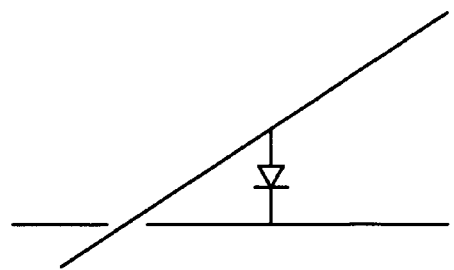
Figure 5C:
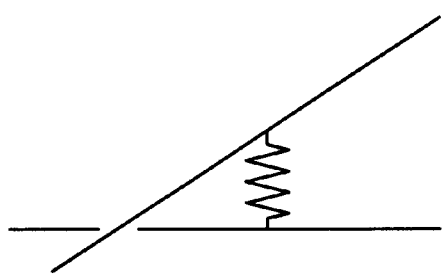
Figure 5D:
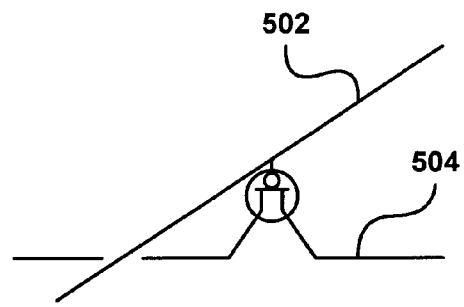
Figure 5E:
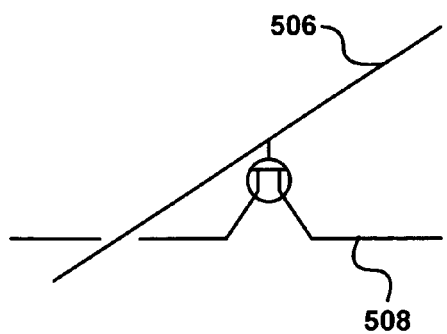
Figure 5F:
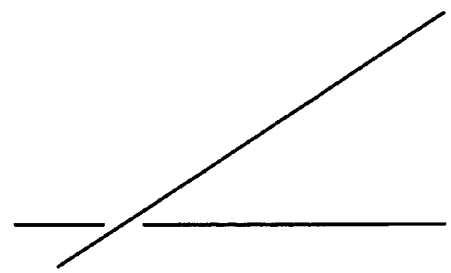

Junctions of nanowires in molecular-junction-nanowire crossbars may be configured, in various techniques depending on the chemical nature of the nanowires and junction-spanning molecules, to form a wide variety of different, simple electronic devices. FIG. 5 schematically illustrates a number of simple electrical components that can be configured at the junctions of nanowires in molecular-junctionnanowire crossbars. A junction may represent (1) a simple conductive connection between the two nanowires, as shown in FIG. 5A; (2) a diode that conducts current in only one direction between the two nanowires, as shown in FIG. 5B; (3) a resistor, with the magnitude of resistance configurable by application of different configuring voltages, as shown in FIG. 5C; (4) a negatively doped field-effect transistor ("nFET"), as shown in FIG. 5D; (5) a positively doped field-effect transistor ("pFET"), as shown in FIG. 5E; and (6) the crossing of two conductive nanowires, with the voltage and current associated with each nanowire completely independent from one another, as shown in FIG. 5F. In the case of the nFET, shown in FIG. 5D, a relatively low voltage state on the gate wire 502 results in current passing through the source/drain wire 504, while a relatively high voltage on the gate wire 502 prevents conduction of current on the source/drain nanowire 504. The pFET of FIG. 5E exhibits opposite behavior, with high voltage on the gate wire 506 facilitating flow of current through the source/drain wire 508, and low voltage on the gate wire 506 preventing flow of current on the source/drain wire 508. Note also that a junction may also be configured as an insulator, essentially interrupting conduction at the junction with respect to both nanowires. Thus, as discussed above with reference to FIGS. 2-5, a two-dimensional molecular-junction-nanowire crossbar may be constructed and then configured as a network of electrical components. Note also that a junction, although shown in FIGS. 5A-F to comprise the junction of two single nanowires, may also comprise a number of junctions between a number of wires in a first layer of a molecular-junction-nanowire crossbar that together comprise a single conductive element and the nanowires in a second nanowire layer that together comprise a second conductive element.

The configurable electrical resistance of molecular junctions is an important and special property of molecular junctions. When certain types of molecules are used for molecular junctions, the initially relatively high resistance of the molecular junction may be lowered by applying a relatively large positive voltage to the molecular junction. The resistance of the molecular junction is generally a function of the magnitude of the highest voltage applied to the junction. By applying higher and higher positive voltages to a junction, the resistance of the junction can be made lower and lower. A relatively low resistance state achieved by application of a positive voltage may be reversed by applying a sufficiently high, negative voltage. Thus, not only is the electrical resistance of a molecular junction configurable, the electrical resistance may also be reconfigurable, depending on the type of molecules forming the molecular junction.

Figure 6:
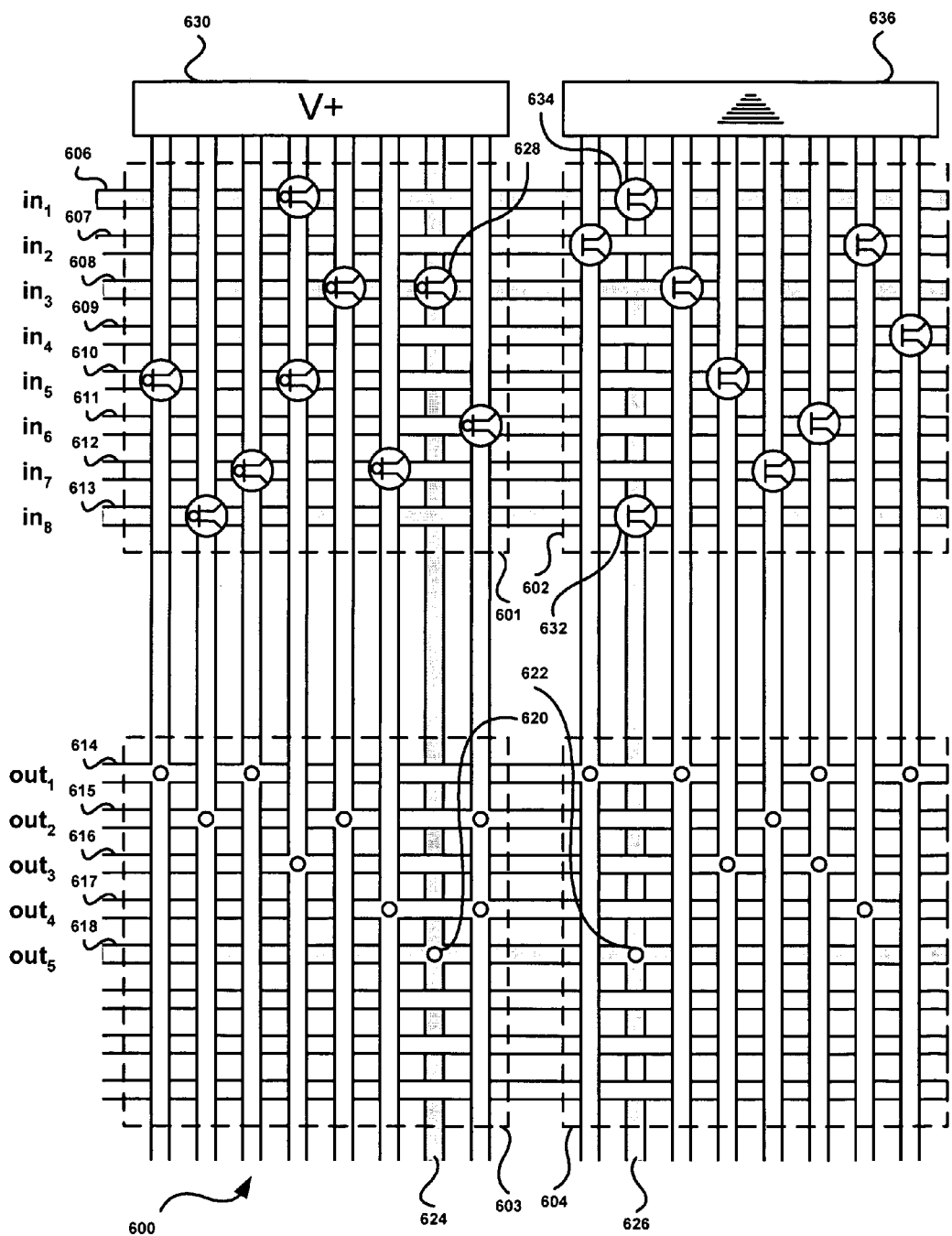
FIG. 6 illustrates an exemplary CS lattice.

A particularly useful type of nanoscale electronic component array based on molecular-junction-nanowire-crossbar technology is referred to as a "complementary/symmetry lattice" ("CS lattice"). FIG. 6 illustrates an exemplary CS lattice. Note that, although CS lattices are generally configured to represent logical and useful circuits, the CS lattice in FIG. 6 is rather arbitrarily configured, and is shown not as a representation of a particular subcircuit implemented by the CS lattice, and may not even be useful or functional, but rather is included to show the basic features of the CS lattice itself. In general, because of the small scales of the molecular-junction-nanowire-crossbar grids, it is difficult to chemically alter individual junctions. Techniques do exist for applying a very small number of molecules to a particular junction, but the techniques are painstakingly time consuming, and unsuitable for mass production. However, it is currently relatively straightforward to chemically alter sub-regions or microregions, comprising a number of junctions using currently available semiconductor manufacturing technologies. The term "microregion" is meant to indicate a scale larger than an individual molecular junction, but not necessarily a particular range of dimensions. It is current technically feasible to fabricate sub-mircon-sized microregions, for example. In the exemplary CS lattice shown in FIG. 6, four distinct, square microregions, demarcated by dashed lines 601-604, are shown within the molecular-junction-nanowire crossbar 600. Microregion 601 is chemically altered so that junctions within microregion 601 may be selectively configured as nFET components. Conversely, microregion 602 has been chemically altered so that junctions within subregion 602 may be selectively configured as pFET components. The microregions 603 and 604 have been chemically configured so that junctions within microregions 603 and 604 can be selectively configured as conductive links that electrically connect the nanowires forming the junctions. In certain embodiments, one set of parallel wires, the horizontal, conductive nanowires in FIG. 6, may be of nanoscale dimensions or of greater, sub-mircoscale or microscale dimensions, while the other set of parallel wires, the vertical semiconductive nanowires in FIG. 6, need to be of nanoscale dimensions in order for a CS-lattice-based circuit to properly function.

In a CS lattice, some number of nanowires is considered as a set of molecular input-signal lines. For example, in the CS lattice shown in FIG. 6, horizontal nanowires 606-613 are considered as inputs, and labeled "$in_1$"-"$in_8$." Similarly, a distinct set of wires is normally considered as a set of molecular output-signal lines. For example, in the CS lattice shown in FIG. 6, horizontal nanowires 614-618 are considered as molecular output-signal lines, and designated in FIG. 6 as "$out_1$"-"$out_5$." Consider, for example, molecular output-signal line, or horizontal nanowire, "$out_5$" 618. Proceeding along nanowire "$out_5$" 618 from left to right, it can be seen that molecular output-signal line "$out_5$" is connected via junction connections 620 and 622, denoted by small circles in the junctions, to vertical nanowires 624 and 626, respectively. Traversing these vertical nanowires 624 and 626, it can be seen that vertical wire 624 is connected with molecular input-signal line "$in_3$" 608 via an nFET 628 and connected with molecular input-signal line "$in_5$" 613 via an nFET 629. Thus, when molecular input-signal lines "$in_3$" 608 and "$in_5$" 613 are low, the nFETs 628 and 629 are activated to connect molecular output-signal line "$out_5$" with a high voltage source 630, potentially driving molecular output-signal line "$out_5$" to a high-voltage state. However, following vertical nanowire 626 upwards from the connection 622 to molecular output-signal line "$out_5$" 618, it can be seen that the vertical nanowire 626 interconnects with molecular input-signal line "$in_8$" 613 via a pFET 632 and interconnects with molecular input-signal line "in," 606 via pFET 634. Whenever molecular input-signal lines "$in_1$" and "$in_8$" are both in a high-voltage, or ON, state, then the pFETs 632 and 634 are activated to interconnect the vertical nanowire 626 with ground 636, essentially shorting vertical nanowire 626 and molecular output-signal line "$out_5$" 618 to ground. When molecular input-signal lines "$in_1$" and "$in_8$" are high, or ON, molecular output-signal line "$out_5$" 618 is low, or OFF. When both of molecular input-signal lines "$in_1$" and "$in_8$" are not high, or ON, and both molecular input-signal lines "$in_3$" and "$in_5$" are not low, or OFF, then molecular output-signal line "$out_5$" is undriven, and in a high impedance state. Thus, the state of molecular output-signal line "$out_5$" 618 depends only on the states of molecular input-signal lines "$in_1$" "$in_3$," and "$in_8$," and a truth table summarizing the response of molecular output-signal line to all possible input-signal-line-states can be provided as follows:

| $in_1$ | $in_3$ | $in_8$ | $out_5$ |
|---|---|---|---|
| 0 | 0 | 0 | 1 |
| 0 | 0 | 1 | high Z |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a molecular-junction-nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes, et al., U.S. Pat. No. 6,256,767B1; Kuekes, et al., U.S. Pat. No. 6,128,214; and Snider, et al., U.S. patent application Ser. No. 10/233,232.

Embodiments of the Present Invention

Figure 7:
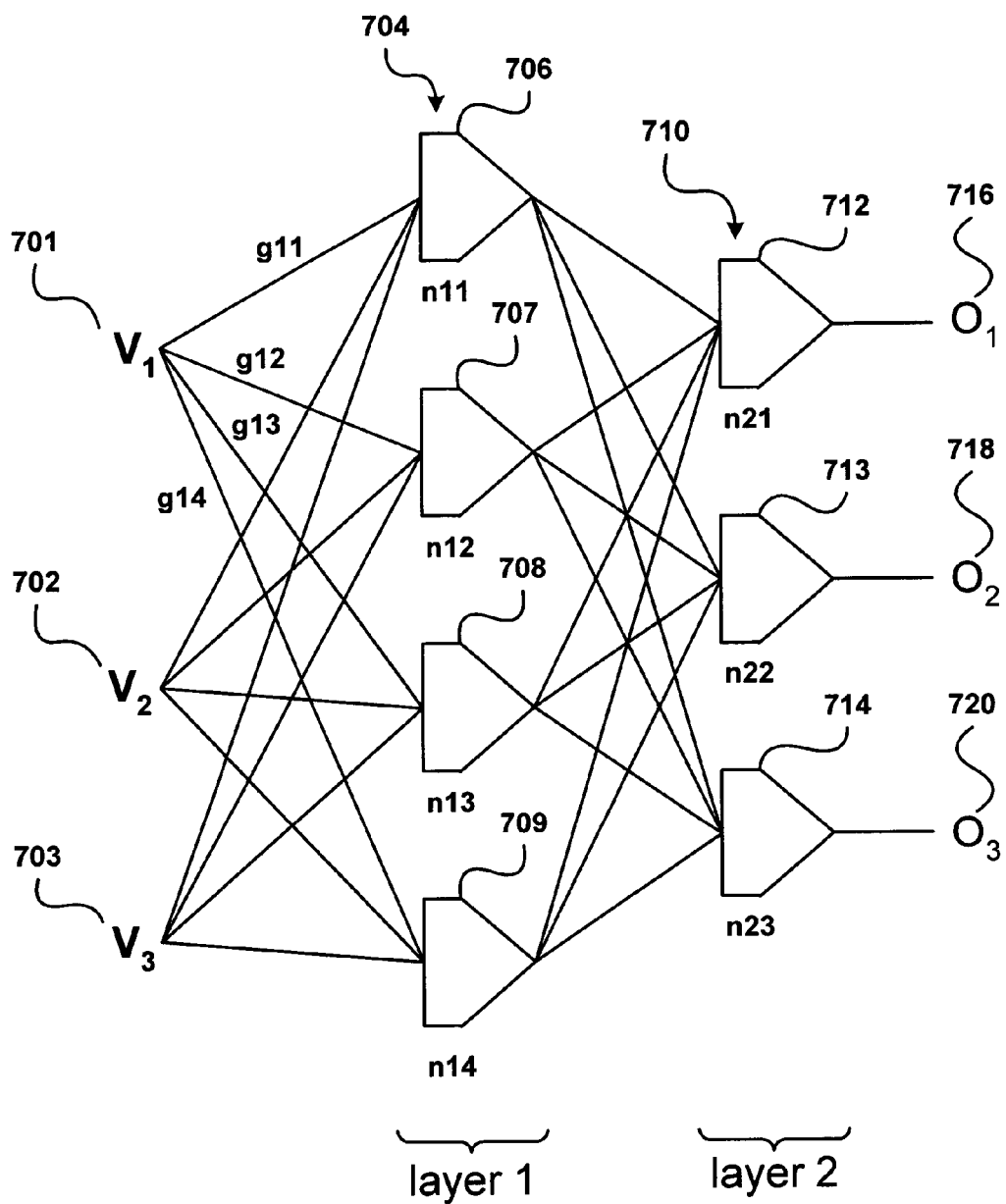
FIG. 7 illustrates a type of neural network circuit that is implemented as an embodiment of the present invention.

There are many different types of neural network circuits. FIG. 7 illustrates an exemplary type of neural network circuit that is implemented, below, as an embodiment of the present invention. As shown in FIG. 7, inputs to the exemplary neural network are voltage signals. In FIG. 7, three voltage-signal inputs 701-703 are shown in a column at the left of the neural network circuit. The neural network circuit comprises a first level of nodes 704 that include nodes "$n_{11}$" 706, "$n_{12}$" 707, "$n_{13}$" 708 and "$n_{14}$" 709. The neural network circuit of FIG. 7 includes a second level of nodes 710 comprising nodes "$n_{21}$" 712 "$n_{22}$," "$n_{23}$" 713 and "$n_{24}$" 714. In the neural network shown in FIG. 7, three output signals "$O_1$" 716, "$O_2$" 718, and "$O_3$" 720 are output, one from each second-level node. The neural network shown in FIG. 7 is fairly symmetric, with each first-level node 706-709 receiving input signals corresponding to all three voltage inputs 701-703, and all second level nodes 712-714 receiving, as inputs, the outputs of all four first-level nodes. However, neural networks may have arbitrary topologies. Certain nodes may receive a subset of the possible inputs from the previous level of nodes or from the inputs to the neural network circuit. Different node layers may have different numbers of nodes, and the weightings and functions implemented by a particular node may be arbitrarily specified.

Figure 8:
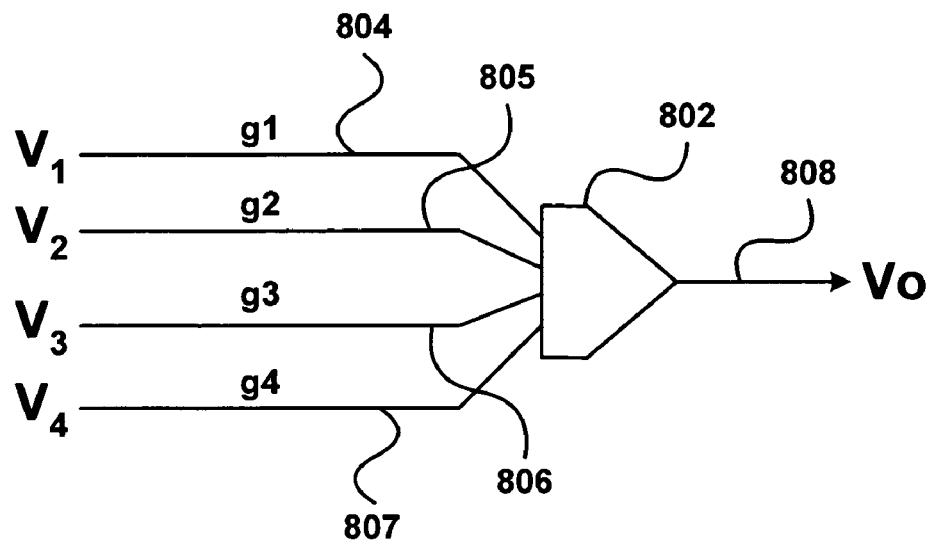
FIG. 8 shows a generalized representation of a node of a neural network circuit.

FIG. 8 shows a generalized representation of a node of a neural network circuit. As shown in FIG. 8, each neural network node 802 receives, as inputs, an arbitrary number of input signal lines 804-807. Each neural network node outputs a single output signal 808. A neural network node applies a weight to each input signal, specified in FIG. 8 by the weighting designations "$g_x$" corresponding to the xth input voltage "$v_x$."

Figure 9:
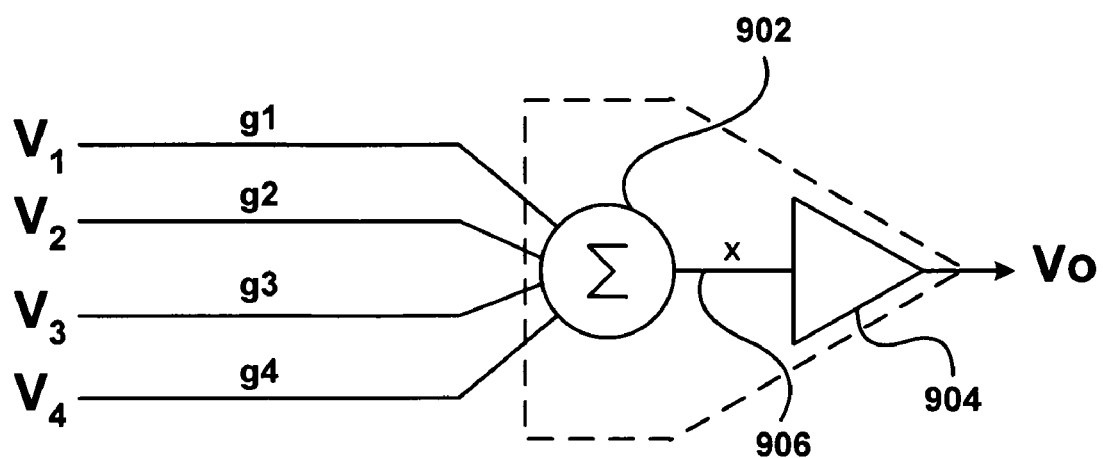
FIG. 9 illustrates the functional operation of a neural network node.

FIG. 9 illustrates the functional operation of a neural network node. As shown in FIG. 9, the neural network node includes a summation function 902 and a thresholding function 904. The weighted input signals are summed by the neural network to produce an intermediate signal "x" 906, which can be expressed as follows:

$$x = \sum_i g_i V_i$$

The sum of the weighted input signals "x" is then passed through a thresholding function 904 to produce an output signal, which can be expressed as follows:

$$V_0 \propto f_{threshold} x$$

Figure 10:
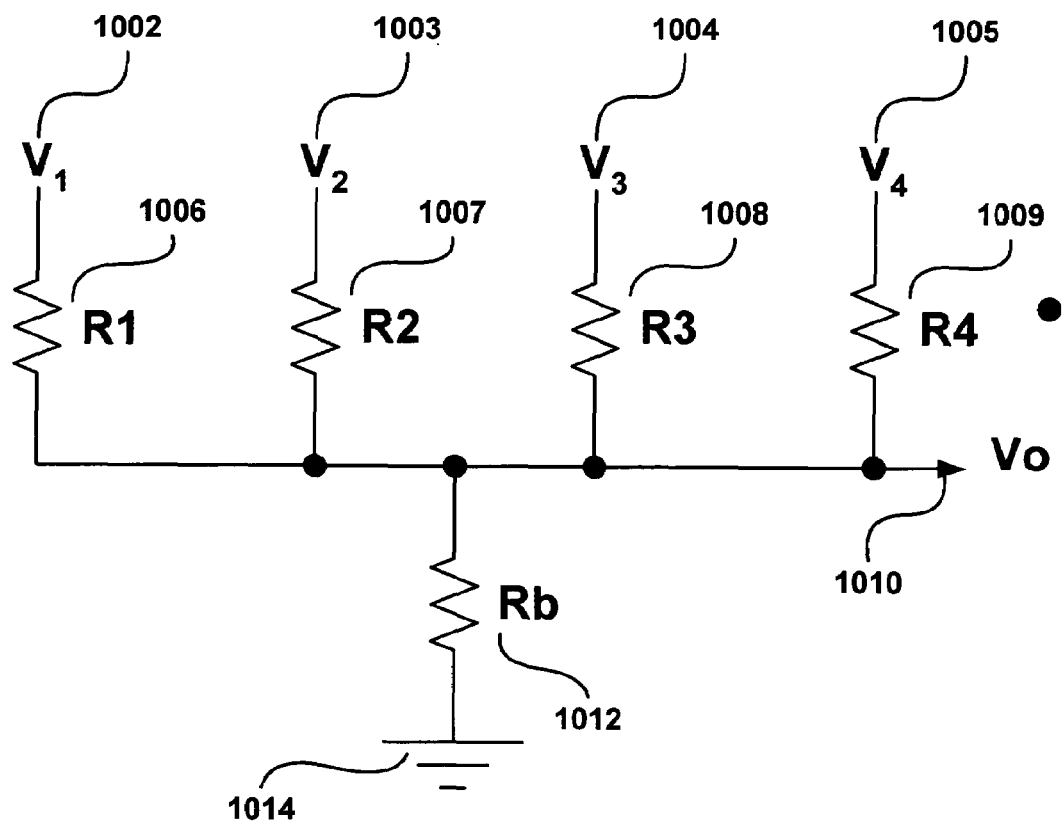
FIG. 10 illustrates implementation of the weighted summing of a number of input voltage signals by a set of parallel resistors.

FIG. 10 illustrates implementation of the summing of a number of weighted input voltage signals by a set of parallel resistors. As shown in FIG. 10, each input signal 1001-1005 is dropped through a resistor 1006-1009, and the resulting voltage signals are collected, in parallel, as an output signal line 1010. Note that the output signal line is connected through a reference resistor 1012 to ground 1014 in order to produce a referenced output voltage. The output voltage for the circuit shown in FIG. 10 is expressed as:

$$V_0 = \frac{\frac{V_1}{R_1} + \frac{V_2}{R_2} + \frac{V_3}{R_3} + \frac{V_4}{R_4} + \ldots}{\frac{1}{R_b} + \frac{1}{R_1} + \frac{1}{R_2} + \frac{1}{R_3} + \frac{1}{R_4} + \ldots}$$

which can be simplified as follows:

$$V_0 = (g_1 V_1 + g_2 V_2 + g_3 V_3 + g_4 V_4 + \ldots)$$

where $$g_1 = \frac{1}{R_1 \left( \frac{1}{R_b} + \frac{1}{R_1} + \frac{1}{R_2} + \frac{1}{R_3} + \frac{1}{R_4} + \ldots \right)}$$

A simple, parallel-resistor circuit implementation, with appropriate choice of resistance values for the resistors, can produce a weighted sum of the input voltages. The ability to configure junction resistors with selected resistances within a molecular-junction-nanowire crossbar greatly simplifies and facilitates manufacture of neural networks using molecular-junction-nanowire crossbars. Thus, the first part of a neural network node can be implemented, in circuitry, using a parallel resistor circuit such as that shown in FIG. 10.

The thresholding function of a neural network node (904 in FIG. 9) can be arbitrarily chosen. A convenient thresholding function is obtained by the elementary function:

$$f_{threshold} \, x = \frac{1}{1 + e^{-x}}$$

Figure 11:
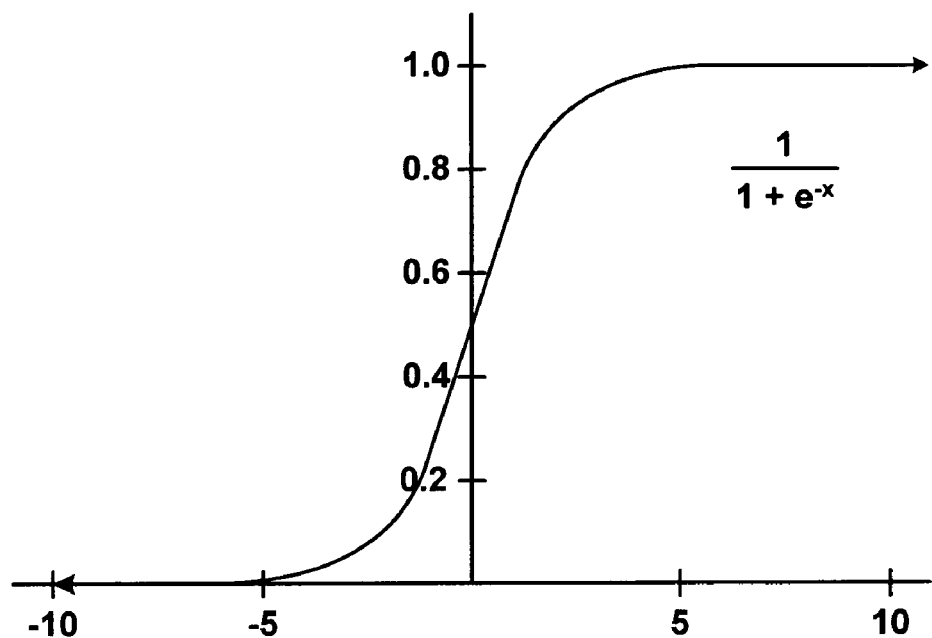
FIG. 11 shows a graph of a threshold function centered about its inflection point at y=0.5.

FIG. 11 shows a graph of the thresholding function, with inflection point at x=0, y=0.5. Basically, a thresholding function compresses a wide variety of possible input values into a narrow range of output values, with most input values resulting in either a low output value or a high output value.

Those input values close to the inflection point of the thresholding function are expanded over the entire range of output values between the low output value and the high output value. Thus, as shown in FIG. 11, input values less than −5 result in an output value of 0, while input values greater than 5 result in an output value of 1. Input values range from between −5 and 5 and result in a range of output value between 0 and 1. As the first derivative at the inflection point increases towards infinity, the thresholding function more and more closely resembles a vertical step between two constant function segments. Of course, the thresholding function can include a constant multiplier, to appropriately adjust the high output value.

Figure 13:
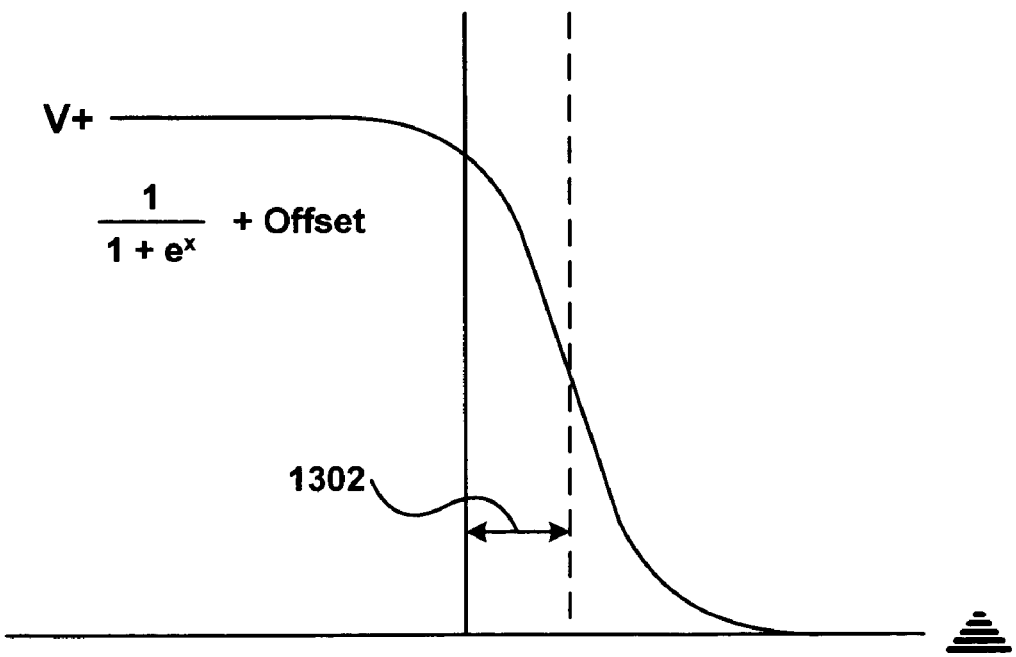
FIG. 13 shows a graph of a mirrored threshold function translated in the positive x direction.
Figure 12:
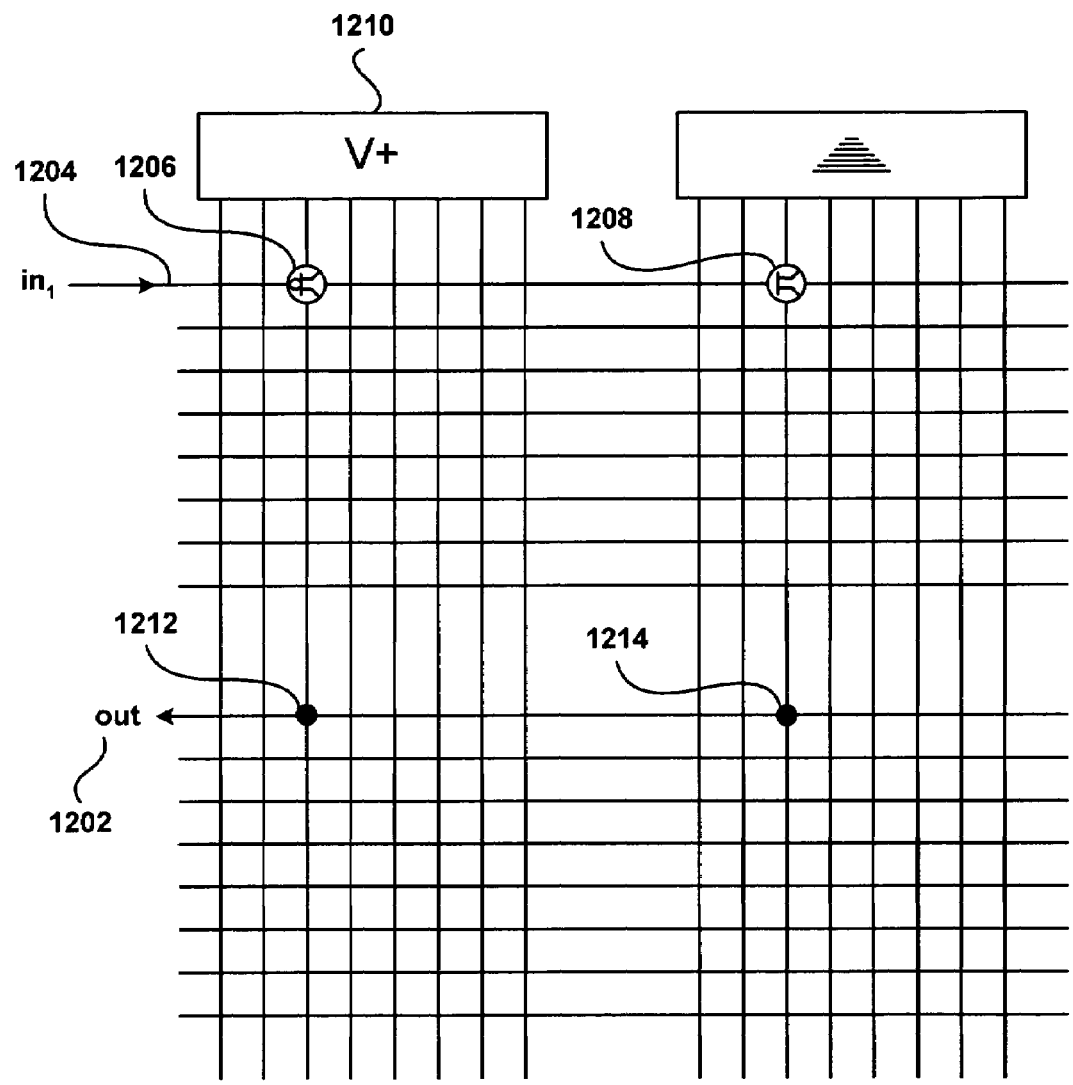
FIG. 12 illustrates implementation of a simple inverter circuit using a molecular-junction-nanowire crossbar.

An inverter circuit may, in addition to inverting an input signal, produce a mirror image of a thresholding function, such as the thresholding function shown in FIG. 11. FIG. 12 illustrates implementation of a simple inverter circuit using a molecular-junction-nanowire crossbar. In FIG. 12, the state of the output nanoscale signal line 1202 is the complement, or inverse, of the state of the input signal line 1204. As can be seen in FIG. 12, when the state of the input nanoscale signal line 1204 is high, the nFET 1206 is not active, while the pFET 1208 is activated, shorting the output signal line 1202 to ground. Conversely, when the input signal is low, then the nFET 1206 is activated while the pFET 1208 is not activated, thereby interconnecting the output nanoscale signal line 1202 with a high voltage source 1210. Note that connections are shown, in FIG. 12 and in subsequent figures, as filled circles at junctions, such as connections 1212 and 1214. Thus, output signal line "out" equals $\overline{in_1}$. If one were to scan the output signal line voltage over a range of input signal line voltages, the scan would produce a graph such as that shown in FIG. 13. Note that FIG. 13 is a mirror image of the graph of the thresholding function shown in FIG. 11, with the mirror image offset to the right by an offset value 1302. Therefore, the circuit implemented in FIG. 12 provides a mirrored, x-offset thresholding function. In this embodiment, the inverter circuit is employed as a thresholder, while in other embodiments, different types of thresholder circuits may be employed.

Figure 14A:
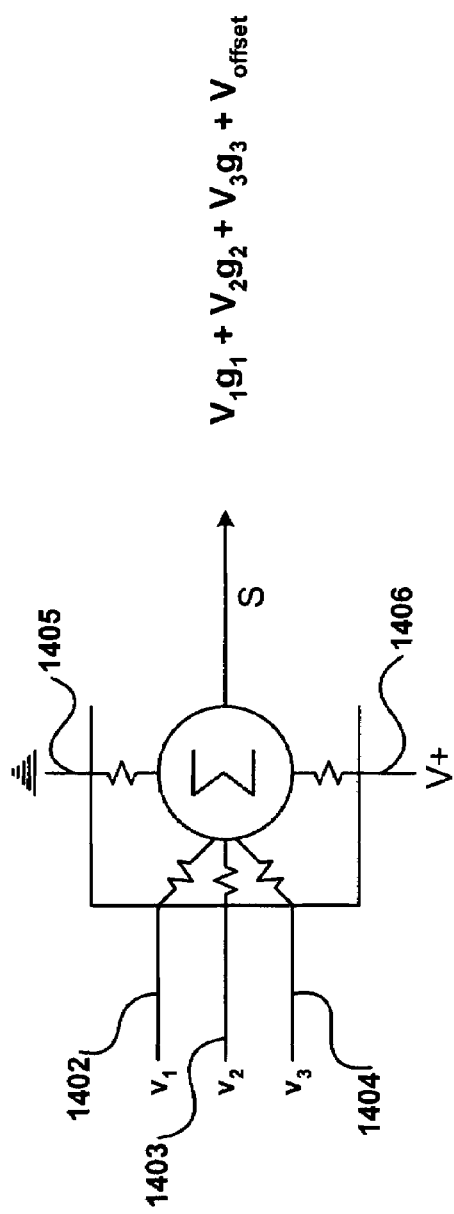
FIGS. 14A-B illustrate the techniques by which neural network nodes are implemented in a molecular-junction-nanowire crossbar.
Figure 14C:
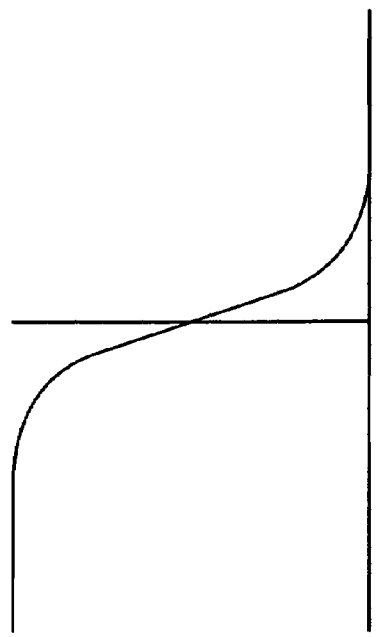
FIG. 14C illustrates the output of a neural network node that is a mirror image of a thresholded weighted sum of input signals.
Figure 14B:
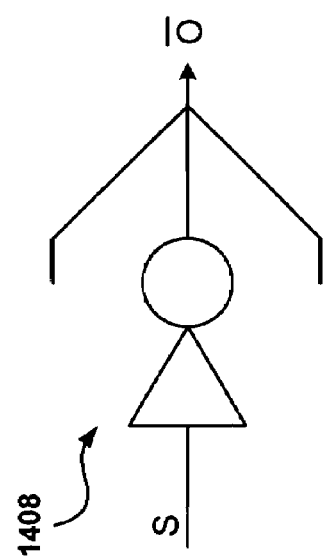

FIGS. 14A-B illustrate the techniques by which neural network nodes are implemented in the neural network implementation, described below. As shown in FIG. 14A, the summation functionality of a neural network node is implemented by a circuit of parallel resistors driven by the voltage input signals 1402-1404, a reference line 1405, and an offset voltage 1406 included to center a subsequent mirrored-and-offset thresholding function. The output from the summation portion of the neural network node, as shown in FIG. 14A, is designated as S, and can be expressed as:

$$S = V_1 g_1 + V_2 g_2 + V_3 g_3 + V_{offset}$$

The thresholding portion of the neural network node, as shown in FIG. 14B, receives the weighted sum signal S and inverts it 1408 to produce an inverted output signal $\overline{O}$. Thus, as shown in FIG. 14C, the output of a neural network node is a mirror image of a thresholded weighted sum of input signals, centered at x=0 by the offset voltage $V_{offset}$ added to S, as shown in the above equation.

Figure 15:
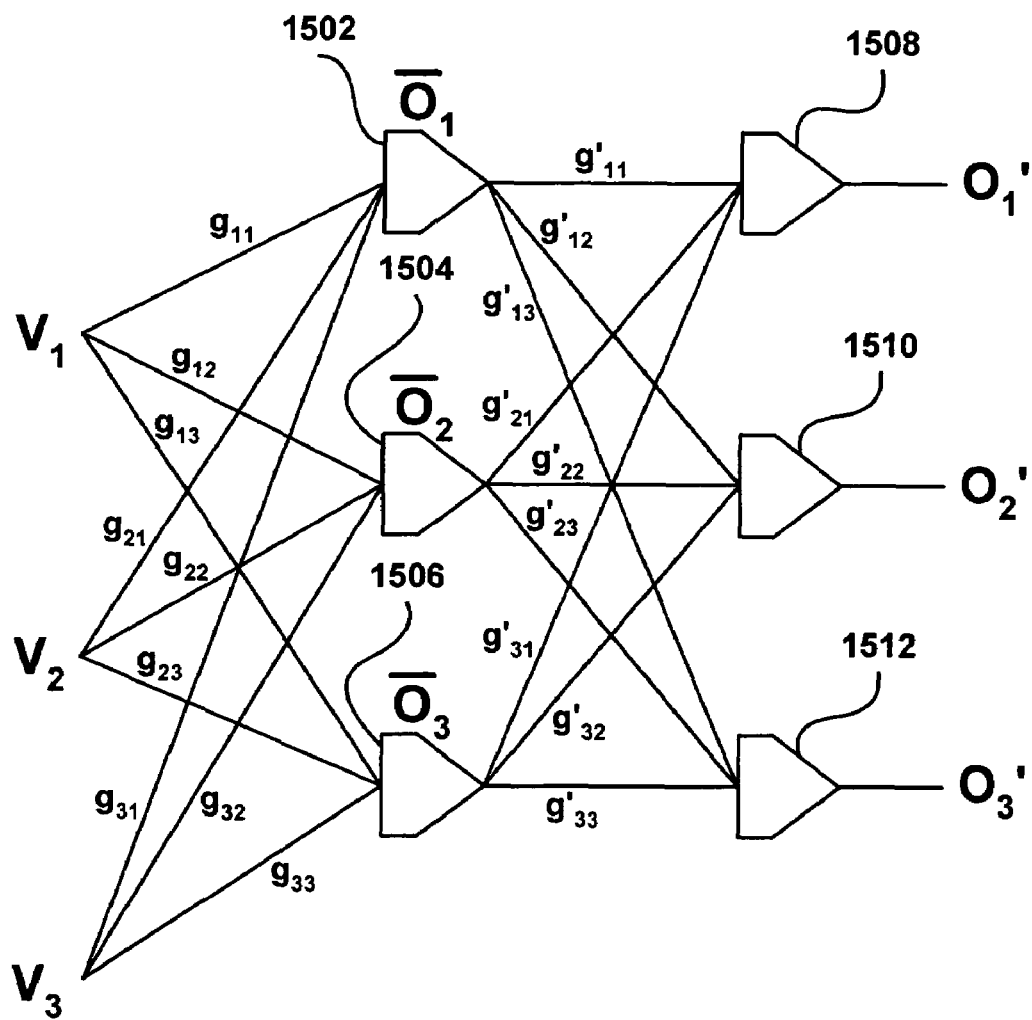
FIG. 15 shows an exemplary 3×3 neural network.

To demonstrate the present invention, a simple 3×3 neural network is implemented, below, using a molecular-junction-nanowire crossbar. FIG. 15 shows the 3×3 neural network implemented below. It is a symmetrical neural network, with each neural network node receiving all possible inputs from either the input signals or from the previous layer of neural network nodes. Note also the designations of weightings and output signals in FIG. 15. Weightings of inputs to first-level nodes are designated as $g_{xy}$, and weightings of input signals to second-layer nodes are designated as $g'_{xy}$, for second-layer node yz. Note also that the outputs from the first-layer neural network nodes are inverted, but that the outputs from the second-layer neural network nodes, having been twice inverted, are not inverted.

Figure 16A:
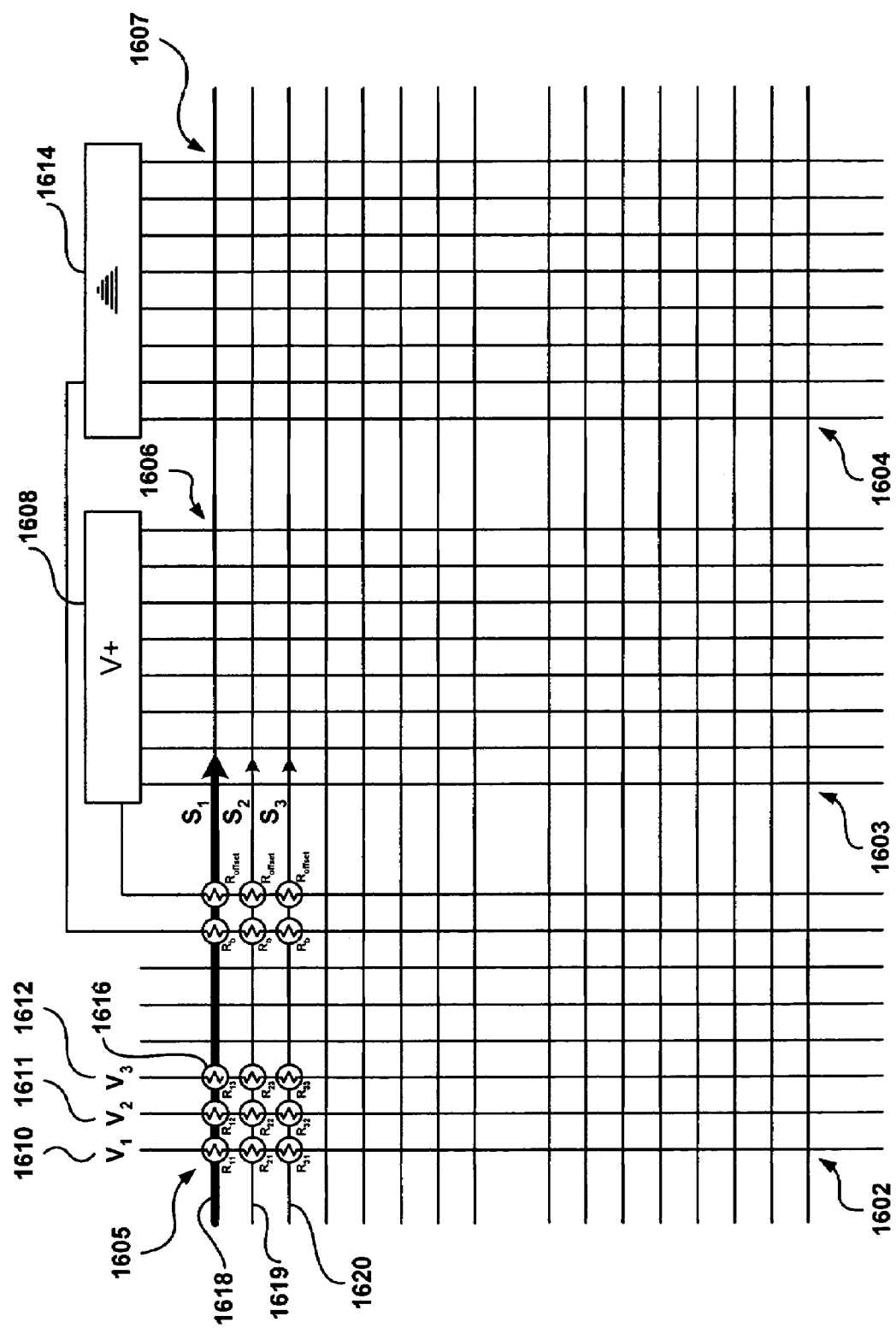
FIGS. 16A-D illustrate configuration, in stepwise fashion, of the 3×3 neural network shown in FIG. 15.

FIGS. 16A-D illustrate configuration, in stepwise fashion of the 3×3 neural network shown in FIG. 15. As shown in FIG. 16A, the molecular-junction-nanowire crossbar used to configure the 3×3 neural network is similar to that shown in FIG. 5, with an additional column of microregions. The bottom three microregions 602-604 are prepared to allow for selective configuration of interconnections at lattice junctions, as discussed above. The first top left-hand microregion 1605 is prepared to allow for selective configuration of resistors at lattice junctions. Moreover, as discussed above, the resistance of the resistors can also be selected. The top middle and right-hand microregions 1606 and 1607 are prepared to allow for selective configuration of nFETs and pFETs, respectively. The molecular-junction-nanowire crossbar is driven by a relatively high voltage source 1608, and by the three input voltage signals 1610-1612. Certain vertical nanowires are potentially connected to ground 1614. First, as shown in FIG. 16A, the weighted sum portions of the first layer of nodes is implemented using selectively configured resistor lattice-point components, such as resistor 1616, in the top left-hand microregion 1605. The resistances of the selectively configured resistors are selected to provide the appropriate weighting of the input signals for the particular neural network node, using mathematical expressions such as those discussed above with reference to FIG. 10. The horizontal nanowire corresponding to the weighted input-voltages-summation function of the first-layer neural network node (1502 in FIG. 15) is shown in FIG. 16A with a bold line 1618. The combined, weighted input signals $S_1$, $S_2$, and $S_3$ corresponding to first-level nodes 1502, 1504, and 1506, respectively, are produced on the top three horizontal nanowires 1618-1620.

Figure 16B:
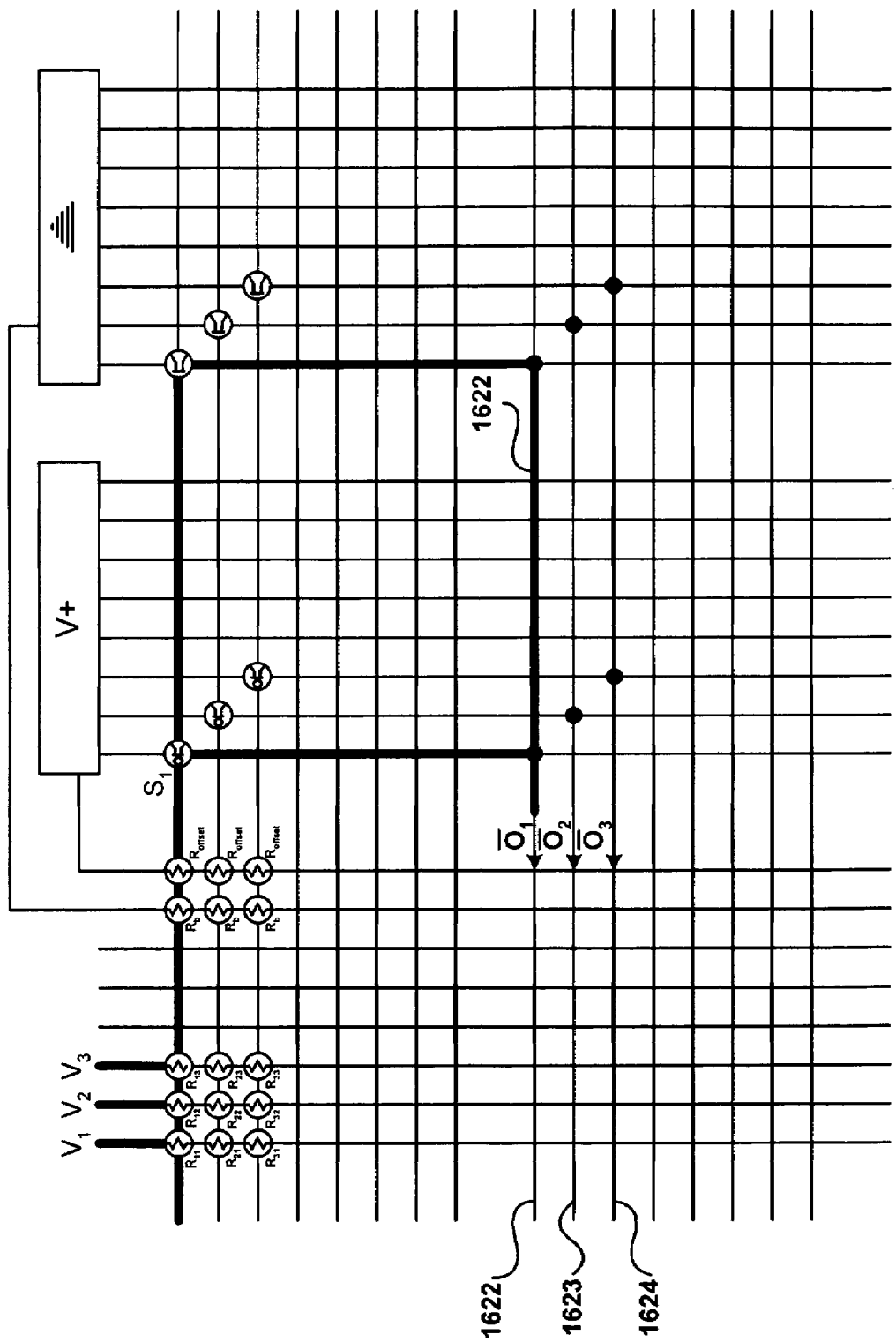

Next, the thresholding functional portion of the first-layer neural network nodes is implemented using three inverter circuits, such as the inverter circuit shown in FIG. 12. In FIG. 16B, the entire molecular-wire circuit for the first-level neural network node 1502 is shown with bolded lines 1622. The inverted outputs of the first-level neural network nodes $\overline{O}_1$, $\overline{O}_2$, and $\overline{O}_3$ are produced on horizontal nanowires 1622-1624.

Figure 16C:
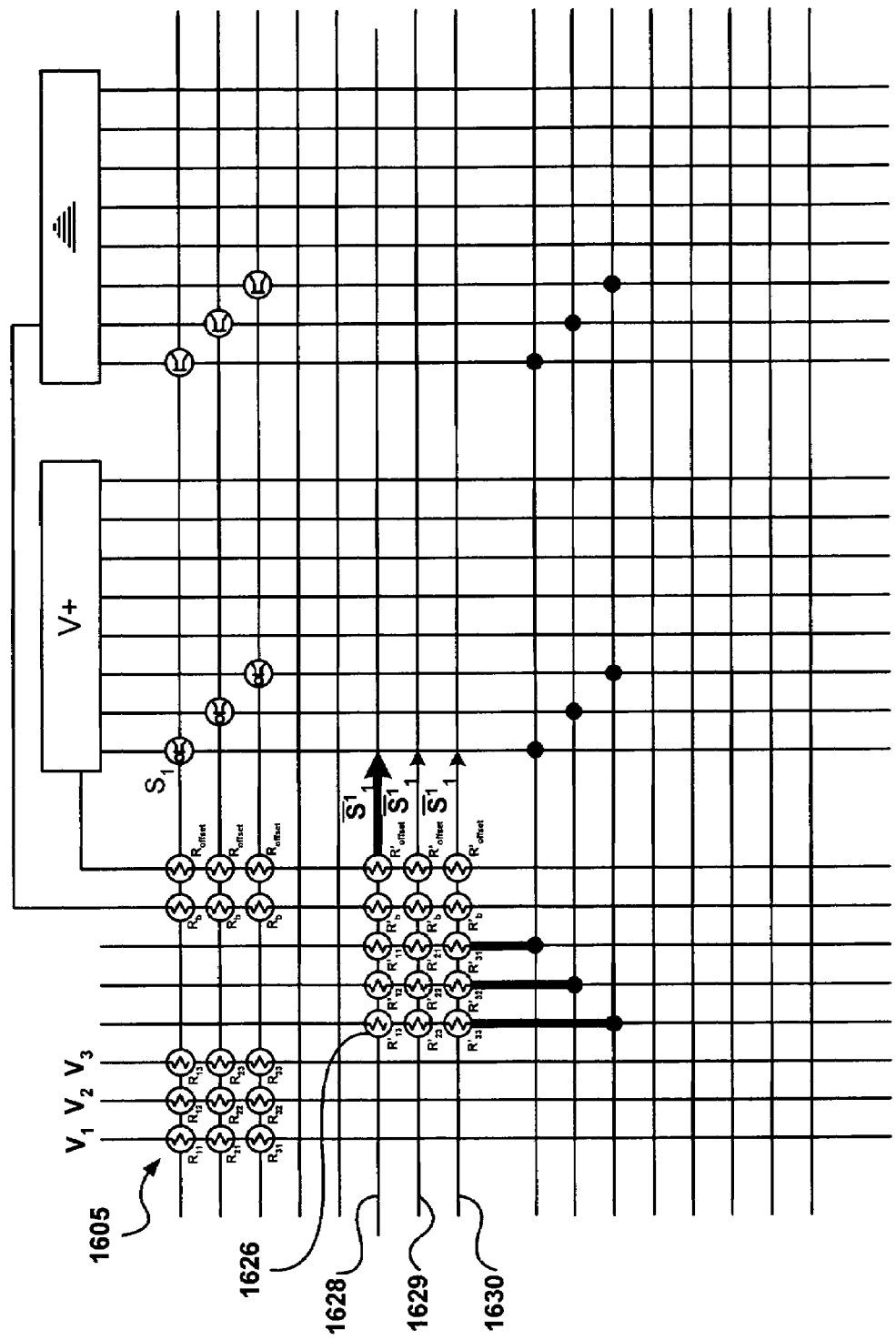

Next, as shown in FIG. 16C, the weighted input summation function of the second-level neural network nodes is implemented using selectively configured resistor elements, such as resistor element 1626, within the top left-hand microregion 1605. The intermediate signals produced by the weighted input summation function of the second-level neural network nodes $\overline{S}_1$, $\overline{S}_2$, and $\overline{S}_3$ are output, as shown in FIG. 16C, to horizontal nanowires 1628-1630.

Figure 16D:
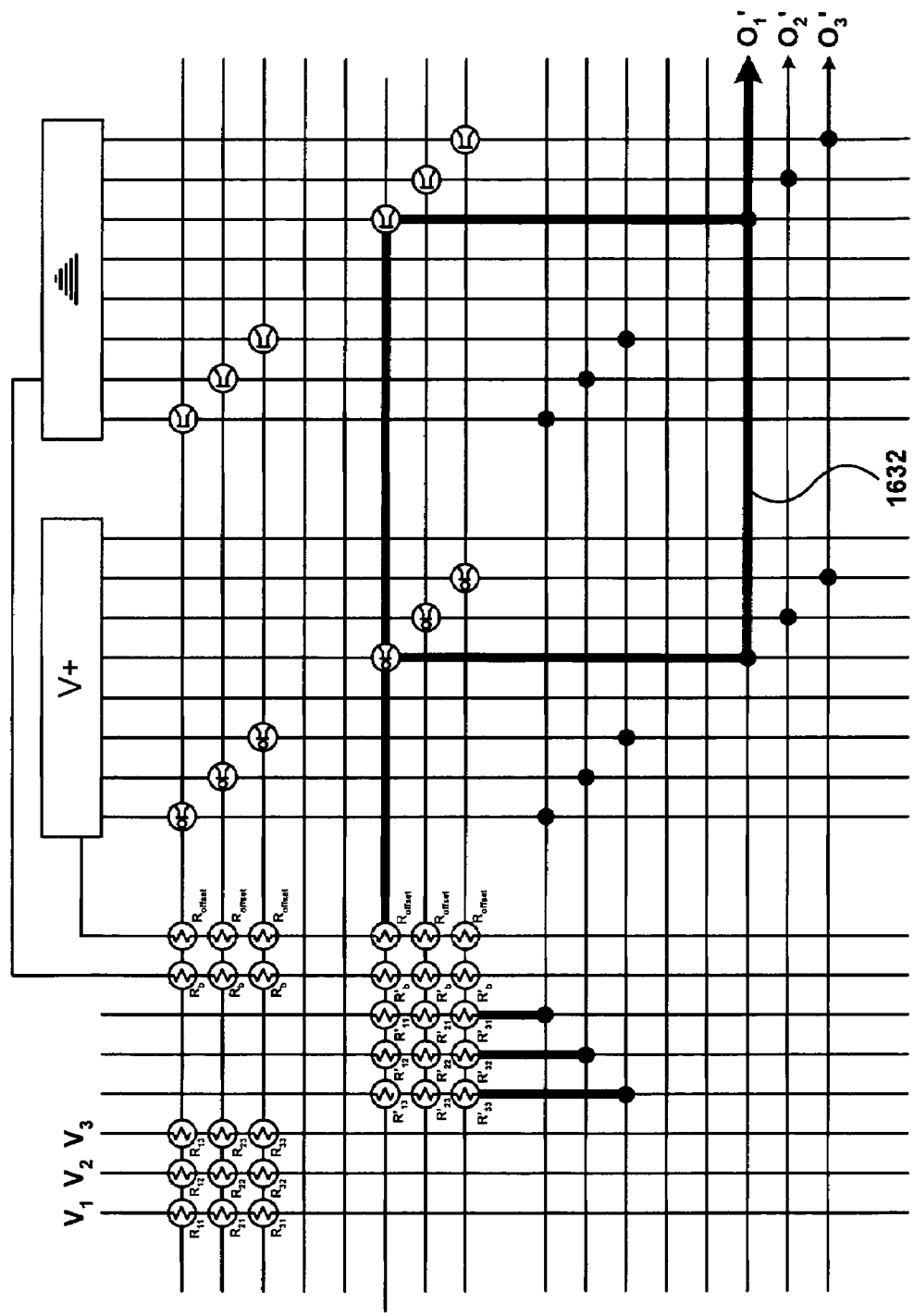

Finally, as shown in FIG. 16D, the thresholding functional portion of the second-level neural network nodes 1508, 1510, and 1512, are implemented using inverter circuits, such as the inverter circuit shown in FIG. 12. In FIG. 16D, the entire molecular-wire circuit corresponding to the second-level neural network node 1508 is shown in bolded lines 1632. Thus, FIG. 16D shows the complete implementation of the 3×3 neural network shown in FIG. 15. The resistance values of the selectively configured resistor elements are chosen to produce the weightings desired for each of the neural network nodes.

Molecular-junction-nanowire crossbars are quite defect and fault tolerant, and can be configured using a variety of different topologies. Molecular-junction-nanowire crossbar implementations of neural networks consume very little power, and have extremely high densities. These extremely dense neural networks can then be combined into extremely dense subsystems that include many additional electrical components, implemented within a set of CS lattices. Thus, rather than simply representing a miniaturization of existing neural network circuits, in isolation, the present invention provides for building neural networks into complex subsystems having transistor densities equal to, or greater than, 1 billion transistors/$cm^2$ or, in other words, having 1.0 giga-transistor/$cm^2$ densities and greater transistor densities.

Although the present invention has been described in terms of a particular embodiment, it is not intended that the invention be limited to this embodiment. Modifications within the spirit of the invention will be apparent to those skilled in the art. For example, as discussed above, various different types of tilings and organizations of the microregions within the molecular-junction-nanowire crossbar and of the nanoscale electrical elements selectively configured at lattice junctions can be used to produce any of an almost limitless number of different m×n neural networks. Resistors are selectively configured at molecular-junction-nanowire crossbar points with resistances computed to introduce the appropriate weightings of input signals into neural network nodes. Each level of neural network nodes inverts output signals, so neural networks configured with odd numbers of levels produce inverted signals that may need to be inverted, in certain applications.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale neural network circuit comprising:
input nanowire signal lines;
output nanowire signal lines; and
at least one layer of neural network nodes programmed into a molecular-junction-nanowire crossbar.

2. The nanoscale neural network circuit of claim 1 wherein the neural network nodes are programmable.

3. The nanoscale neural network circuit of claim 1 implemented in a complementary/symmetry lattice additionally including other nanoscale components that, together with the nanoscale neural network circuit, compose an electrical subsystem.

4. The electrical subsystem of claim 3 wherein the nanoscale components are configured together at densities within the electrical subsystem at densities greater than 1.0 giga-transistors/$cm^2$.

5. The nanoscale neural network circuit of claim 1 wherein each neural network node comprises:
a set of resistors programmed into the molecular-junction-nanowire crossbar to weight selected input signals and combine the weighted input signals onto a nanowire carrying the weighted, combined signal S; and
a thresholder programmed into the molecular-junction-nanowire crossbar comprising a selectively configured pFET and a selectively configured nFET that thresholds the signal S.

6. The nanoscale neural network circuit of claim 1 wherein the resistances of the resistors is chosen to provide a precise weighting of the input signals combined to produce signal S.

7. The nanoscale neural network circuit of claim 1 wherein microscale non-semiconductive signal lines are used in place of nanoscale non-semiconductive signal lines.

8. A method for configuring a nanoscale neural network circuit, the method comprising:
providing a molecular-junction-nanowire crossbar with microregions prepared for selective configuration of pFETs, nFETs, and connection elements;
selecting a number of input nanowire signal lines;
selecting a number of output nanowire signal lines; and
programming electrical components at the junctions of a molecular-junction-nanowire crossbar to construct at least one layer of neural network nodes.

9. The method of claim 8 further including:
configuring each neural network node by:
programming a set of resistors to weight the selected input signals and to combine the weighted input signals onto a nanowire carrying the weighted, combined signal S; and
programming a pFET and an nFET that inverts the signal S.

10. The method of claim 9 wherein selectively configuring a pFET and an nFET that inverts the signal S further includes:
selecting resistances of the selectively configured resistors to provide a precise weighting of the input signals combined to produce signal S.

11. A nanoscale neural network circuit comprising:
input nanowire signal lines;
output nanowire signal lines; and
at least one layer of neural-network-node means.

12. A nanoscale thresholding circuit comprising:
an input nanowire signal line;
an output nanowire signal line; and
junction components programmed into a molecular-junction-nanowire crossbar.

13. The nanoscale thresholding circuit of claim 12 wherein the junction components are programmable.

14. The nanoscale thresholding circuit of claim 12 implemented in a complementary/symmetry lattice additionally including other nanoscale components that, together with the nanoscale thresholding circuit, compose an electrical subsystem.

15. The electrical subsystem of claim 14 wherein the nanoscale components are configured together at densities within the electrical subsystem at densities greater than 1.0 giga-transistors/$cm^2$.

16. The nanoscale thresholding circuit of claim 12 wherein the junction components include:
an nFET transistor connecting the input nanowire signal line to a relatively high voltage source; and
a pFET transistor connecting the input nanowire signal line to ground.

17. The nanoscale thresholding circuit of claim 16 wherein the junction components further include:
a first interconnection interconnecting the output nanowire signal line to a relatively high voltage source; and
a second interconnection interconnecting the output nanowire signal line to ground.

* * * * *

UNITED STATES PATENT AND TRADEMARK OFFICE
CERTIFICATE OF CORRECTION

| | |
|---|---|
| PATENT NO. | : 7,359,888 B2 |
| APPLICATION NO. | : 10/355801 |
| DATED | : April 15, 2008 |
| INVENTOR(S) | : Greg Snider |

It is certified that error appears in the above-identified patent and that said Letters Patent is hereby corrected as shown below:

In column 6, line 29, delete "$v_{w'}$" and insert -- $v_{w''}$ --, therefor.

In column 8, line 53, delete "in," and insert -- $in_1$ --, therefor.

Signed and Sealed this

Fourteenth Day of July, 2009

JOHN DOLL
*Acting Director of the United States Patent and Trademark Office*